United States Patent
Feng et al.

(10) Patent No.: US 8,798,410 B2
(45) Date of Patent: Aug. 5, 2014

(54) OPTICAL SYSTEM WITH INTEGRATED PHOTODETECTOR USING A SELF-ALIGNED DOUBLE U-GROOVE STRUCTURE

(75) Inventors: Ningning Feng, Arcadia, CA (US); Xiaochen Sun, Pomona, CA (US); Dawei Zheng, Irvine, CA (US)

(73) Assignee: Laxense Inc., Walnut, CA (US)

( * ) Notice: Subject to any disclaimer, the term of this patent is extended or adjusted under 35 U.S.C. 154(b) by 168 days.

(21) Appl. No.: 13/494,803

(22) Filed: Jun. 12, 2012

(65) Prior Publication Data

US 2013/0330034 A1  Dec. 12, 2013

(51) Int. Cl.
- *G02B 6/12* (2006.01)
- *H01L 31/12* (2006.01)
- *H01L 33/58* (2010.01)

(52) U.S. Cl.
USPC .......... 385/14; 438/25; 257/E33.077

(58) Field of Classification Search
USPC ........ 385/47–49, 88–92, 147, 29–33; 438/31, 438/25; 257/E33.067, E33.077
See application file for complete search history.

(56) References Cited

U.S. PATENT DOCUMENTS

| | | | | |
|---|---|---|---|---|
| 5,064,777 | A | * | 11/1991 | Dhong et al. ............ 438/242 |
| 5,905,831 | A | | 5/1999 | Boudreau et al. |
| 5,984,534 | A | * | 11/1999 | Elderstig et al. ........... 385/90 |
| 6,511,235 | B2 | | 1/2003 | Wu et al. |
| 6,516,131 | B1 | | 2/2003 | Tullis |
| 6,516,448 | B1 | | 2/2003 | Vieider et al. |
| 7,306,378 | B2 | | 12/2007 | Alduino et al. |
| 7,530,661 | B2 | * | 5/2009 | Hess .......................... 347/20 |
| 7,780,302 | B2 | * | 8/2010 | Wang ......................... 359/871 |
| 2010/0006937 | A1 | * | 1/2010 | Lee ............................ 257/343 |
| 2012/0025874 | A1 | * | 2/2012 | Saikaku et al. ............ 327/109 |
| 2012/0057822 | A1 | | 3/2012 | Wu et al. |

* cited by examiner

*Primary Examiner* — Akm Enayet Ullah
(74) *Attorney, Agent, or Firm* — Chen Yoshimura LLP

(57) ABSTRACT

An optical system includes a silicon substrate, a 45-degree or 54.7-degree reflector formed in the silicon substrate, deeply etched double U-shape trenches formed in the silicon substrate, a thin film disposed on the reflector surface with total or partial optical refection, a top and bottom surface contacted p-i-n structure formed in the silicon substrate for optical power monitoring, a plurality of rectangular or wedge shaped spacers formed on top surface of the silicon substrate, and a surface emitting light source flip-chip bonded on the silicon substrate via the spacers.

26 Claims, 5 Drawing Sheets

OPTICAL SYSTEM WITH INTEGRATED PHOTODETECTOR USING A SELF-ALIGNED DOUBLE U-GROOVE STRUCTURE

BACKGROUND OF THE INVENTION

1. Field of the Invention

The invention relates to integrated optoelectronic modules. In particular, the invention relates to integrated optoelectronic modules forming optical systems with transmitters and receivers.

2. Description of the Related Art

An optical communication system typically includes an optical transmitter and an optical receiver. The optical transmitter includes a light source to generate light and an encoder structure to encode electrical signals into optical signals by modulating the light. The optical receiver includes a photodetector (PD) for decoding optical signals into electrical signals. Usually, the optical transmitter is more challenging to build than the optical receiver due to its packaging complexity. In most cases, the technology applied to optical transmitter modules can be easily employed in optical receiver modules. A commonly employed optical transmitter module includes a light source, a monitor PD, optical fibers, optical elements and micro-assembly structures to align the optical fibers and couple light from the light source to the optical fibers. The large dimensional difference between the emitting aperture of the light source (in the micron or sub-micron range) and the cross-section of the optical fibers (tens of microns) can result in a large mode-mismatch loss. The mode-mismatch loss is caused by two mechanisms: the mode-size mismatch and the mode-center misalignment. In addition, optical fibers usually have a small numerical aperture (NA). The NA is a parameter characterizing the range of angles over which an optical system can accept or emit light. Due to its small NA, the optical fiber only receives light incident within a small angular range.

Existing practices to resolve the optical fiber alignment problem include using micro-assembled microlens systems and self-aligned on-chip structures. The micro-assembled microlens systems can reduce the mode-size mismatch by focusing divergent laser beam into collimated light that can be coupled into optical fibers with a small NA. A drawback is that the micro-assembly packaging process requires high precision active alignment and complicated optical elements. It increases the complicity of the packaging process and cost. Self-aligned on-chip structures are usually employed to relax the active alignment requirement and packaging cost. Commonly employed solutions are focused on the self-aligned on-chip V-groove structure. This approach includes forming a reflecting mirror and V-groove alignment structure on a substrate using wet chemicals (such as KOH or TMAH) in one or multiple consecutive steps. The alignment precision is fully determined by the lithographic window opening and the solution etching rates between competing crystalline planes. Usually a few micrometers alignment precision can be achieved. Further improvement of the alignment accuracy requires precisely controlled etching time and rates between different crystalline orientations.

High density optical communication systems require high precision passive multichannel fiber alignment. Such requirement poses a challenge to currently employed approaches, especially to the final cost of the optical systems. There is a need to develop a low cost solution that requires less packaging complicity while maintain high optical performance.

SUMMARY OF THE INVENTION

An objective of the invention is to provide methods of forming an optical system with optical transmitter and receiver. An optical transmitter includes a silicon substrate; a 45-degree or 54.7-degree reflector formed in the silicon substrate; deeply etched double U-shape trenches formed in the silicon substrate; a thin film disposed on the reflector surface with total or partial optical refection; a top and bottom surface contacted $p^+$-i-$n^+$, $p^+$-p-$p^+$, or $p^+$-n-$p^+$ structure formed in the silicon substrate for optical power monitoring; a plurality of rectangular or wedge shaped spacers formed on a top surface of the silicon substrate; a light source flip-chip bonded on the silicon substrate supported by the spacers.

Additional features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, the present invention provides an optical system which includes: a silicon substrate in a <100> crystal orientation, having a horizontal first surface formed by a <100> crystalline plane; a reflecting surface formed by a <110> or <111> crystalline plane of the silicon substrate near the first surface, and a double trench structure formed in the silicon substrate for receiving an end portion of an optical fiber, including a first trench located below the first surface of the silicon substrate and a second trench located below a bottom surface of the first trench, the double trench structure extending horizontally along a longitudinal line with a first end located near the reflecting surface, a vertical plane passing through the longitudinal line being perpendicular to the reflecting surface.

The reflecting surface forms a 45° or 54.7° angle with the first surface of the silicon substrate. The reflecting surface may be coated with an anti-reflection coating which partially reflects a light incident upon it and partially transmits the light into the silicon substrate. Each of the first and second trenches may have a rectangular cross section in a plane perpendicular to the longitudinal line. The two top edges of the lower trench may be parallel or non-parallel to each other.

The silicon substrate may further include a second surface substantially parallel to the first surface; a first doped area formed in the first surface of the silicon substrate; and a second doped area formed in the second surface of the silicon substrate, wherein the first doped area, the undoped portion of the silicon substrate, and the second doped area form a vertical $p^+$-i-$n^+$, $p^+$-p-$p^+$, or $p^+$-n-$p^+$ junction.

The optical system may further comprise one or more spacers disposed on the first surface of the silicon substrate adjacent the reflecting surface for mounting a light source or a photodetector on the silicon substrate. The spacers may have a wedge shape.

The optical system may further comprise a surface emitting light source mounted on the silicon substrate via the spacers in a flip-chip arrangement, the light source having an emitting aperture located above the reflecting surface, and an optical fiber disposed in the double trench structure and resting on two top edges of the lower trench, wherein the reflecting surface reflects an incident light from the light source into an end of the optical fiber.

The optical system may further comprise a surface normal photodetector mounted on the silicon substrate via the spacers in a flip-chip arrangement, the photodetector having a receiving aperture located above the reflecting surface, and an optical fiber disposed in the double trench structure and resting on two top edges of the lower trench, wherein the reflecting surface reflects an incident light from the optical fiber into the photodetector.

In another aspect, the present invention provides a method of coupling light from a light source to an optical fiber, which includes: (a) providing a silicon substrate in a <100> crystal orientation having a horizontal first surface formed by a <100> crystalline plane; (b) forming a reflecting surface by a <110> or <111> crystalline plane of the silicon substrate near the first surface of the silicon substrate; and (c) forming a double trench structure in the silicon substrate for receiving an end portion of the optical fiber, including a first trench located below the first surface of the silicon substrate and a second trench located below a bottom surface of the first trench, the double trench structure extending horizontally along a longitudinal line with a first end located near the reflecting surface, a vertical plane passing through the longitudinal line being perpendicular to the reflecting surface.

Step (b) may include etching a V-shaped pit with four tilted side walls into the first surface of the silicon substrate. Step (c) may include: etching the first trench into the first side of the silicon substrate; and subsequently etching the second trench into the bottom surface of the first trench, wherein each of the first and second trenches has a rectangular cross section in a plane perpendicular to the longitudinal line.

It is to be understood that both the foregoing general description and the following detailed description are exemplary and explanatory and are intended to provide further explanation of the invention as claimed.

DETAILED DESCRIPTION OF THE PREFERRED EMBODIMENTS

The invention provides methods of forming an optical system. The optical system includes an optical transmitter module with integrated photodetector and an optical receiver module. The optical transmitter module is more complex than the optical receiver module. The invention description is focused on the optical transmitter. The same technology can be applied to both modules with little modification.

According to an embodiment of the present invention, an optical transmitter module includes a silicon substrate with a 45-degree or 54.7-degree reflector formed in the silicon substrate. The module also includes deeply etched double U-shape trenches formed in the silicon substrate to passively align an optical fiber with a light source. A thin film is disposed on the reflector surface with total or partial optical refection, and a top and bottom surface contacted p-i-n structure is formed in the silicon substrate to form a photodetector for optical power monitoring. A plurality of rectangular or wedge shaped spacers are formed on the top surface of the silicon substrate to provide vertical alignment accuracy and/or angled optical arrangement for a light source which is flip-chip bonded on the silicon substrate.

Figure 1A:
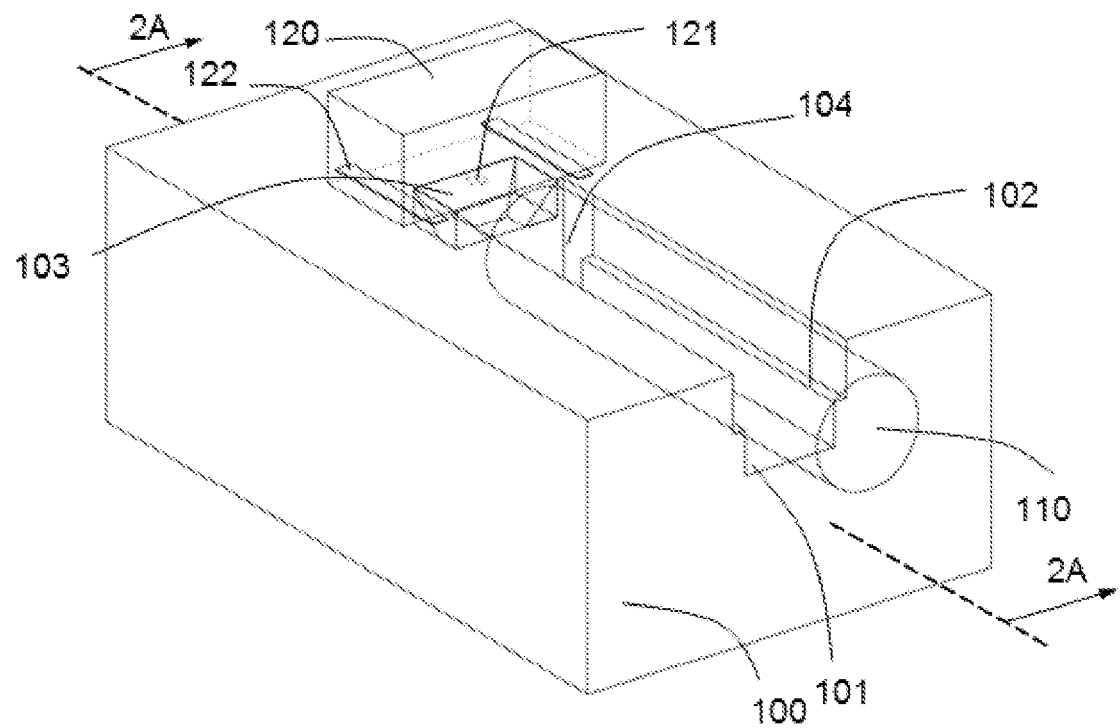
FIG. 1A is a perspective schematic diagram illustrating an optical transmitter according to an embodiment of the present invention. The transmitter includes a 45° mirror, a double U-groove structure, and a flip-chip bonded optical source and an optical fiber self-aligned inside the U-grooves.
Figure 1B:
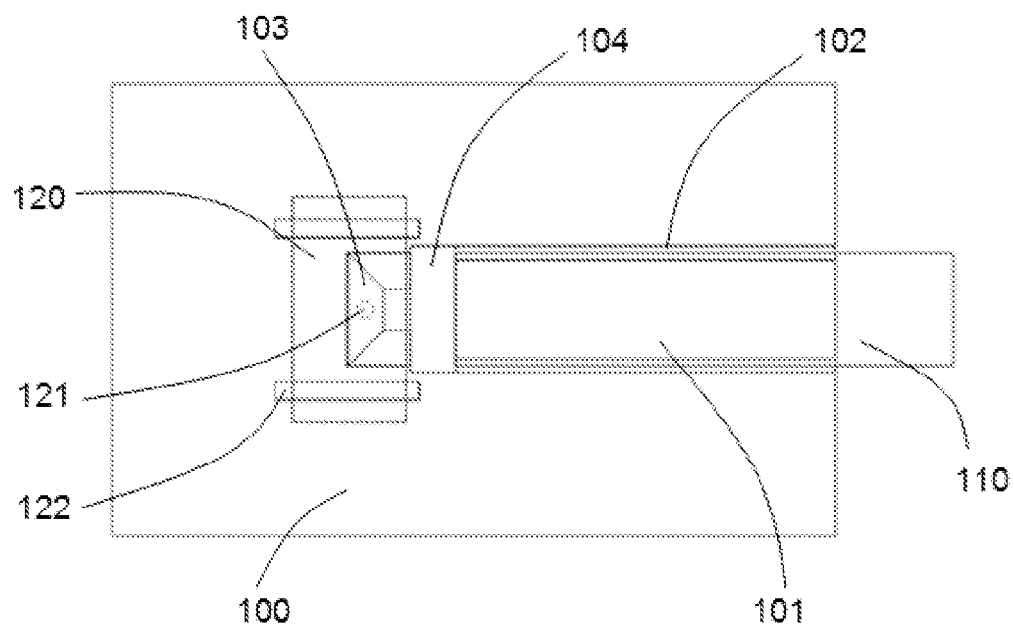
FIG. 1B is a top view of the optical transmitter shown in FIG. 1A.
Figure 1C:
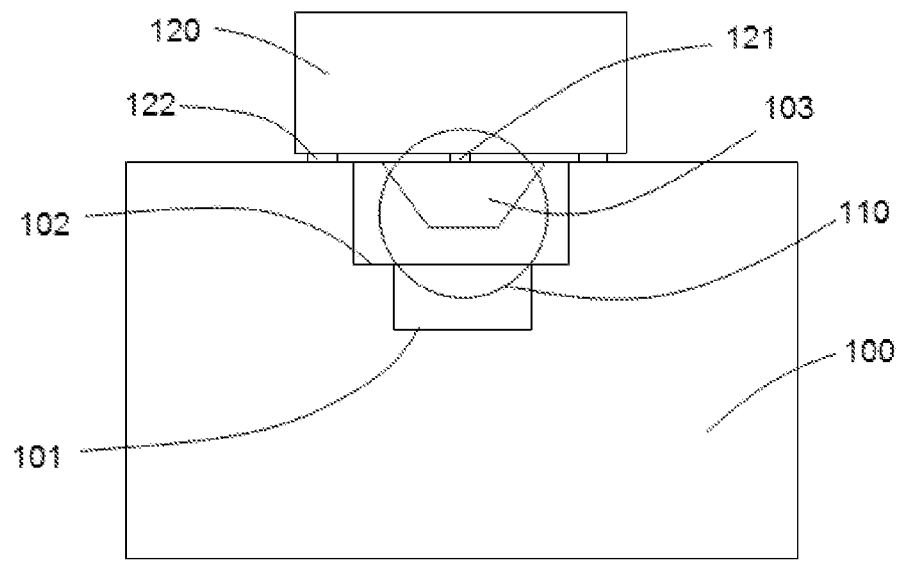
FIG. 1C is a front view of the optical transmitter shown in FIG. 1A.

An embodiment of the present invention is described with reference to FIGS. 1A-2B. FIG. 1A is a perspective schematic diagram illustrating an optical transmitter according to the embodiment. FIG. 1B and FIG. 1C are the top view and front view of the optical transmitter. The components are drawn as if they were transparent. The transmitter includes a 45° mirror (reflecting surface) 103 formed on a silicon substrate 100 for reflecting vertically incident light emitting from the aperture 121 of a flip-chip bonded light source 120 into the input end 111 of a horizontally placed optical fiber 110. The silicon substrate 100 has a <100> crystal orientation with a first (top) horizontal surface and a second (bottom) horizontal surface facing generally opposite to the top surface. The mirror 103 is formed by wet-etching the silicon substrate 100 from the crystalline plane <100> (top surface) towards the crystalline plane <110>. More specifically, the mirror 103 is formed by etching a V-shaped pit with four 45° tilted side walls using wet etching chemicals. The front 45° wall 103 is used as the reflecting surface.

The optical transmitter includes a double U-groove structure with two terraced horizontal trenches 101 and 102 in the substrate 100 for passively aligning optical fiber with the light source when packaging. The two trenches extend horizontally in a longitudinal direction; a vertical plane that passes through a longitudinal line is perpendicular to the surface of the mirror 103. Each trench has a rectangular shaped cross section in a plane perpendicular to the longitudinal line, with vertical side walls. The lower trench 101 is opened in the bottom surface of the upper trench 102. The optical fiber sits horizontally in the double U-groove, supported by the parallel top edges of the lower U-groove trench 101. The opening position of the lower U-groove trench 101 fully determines the horizontal position of the fiber placement. The vertical position of the fiber is determined by the combination of the opening width of the lower U-groove trench 101 and the height of the upper U-groove trench 102. The total sinking depth of the fiber center is the height of the upper trench plus the sinking depth of the fiber on the lower trench. In one particular embodiment, the width of the lower trench 101 is 120 µm, its depth is 62.5 µm, the width of the upper trench is 130 µm, its depth is 37.5 µm, and the diameter of the fiber is 125 µm. In this particular embodiment, the total sinking depth of the fiber center is 72.5 µm, or in other words, 20 µm below the horizontal first (top) surface of the silicon substrate 100.

Comparing to conventional V-groove technology, the double U-groove structure employs dry etching technology by etching into the <100> plane of the silicon substrate. In one embodiment, the upper trench is etched first, and the lower trench is etched into the bottom of the upper trench. In another embodiment, the lower trench is etched first, and the self-aligned upper trench is etched with a lithographic opening larger than the width of the lower trench. Therefore the alignment accuracy in both vertical and horizontal directions can be well controlled by the lithography and etching accuracy. During the processing, a lithography overlap between the V-shaped pit for the mirror 103 and U-shaped grooves is necessary to ensure the process tolerance. The overlapped region eventually forms a deep trench 104 in front of the fiber end 111. In certain circumstance, such trench is made by a post-process diamond saw cutting step to ensure that no optical obstacles are left during the process in the overlap region. The upper U-groove trench 102 provides additional packaging guidance and mechanical strength when filled with epoxy. In addition, the much smaller top opening width of the double U-groove structure comparing to V-groove case makes high density multiple-channel application feasible.

A plurality of spacers 122 are formed as ridges extending from the silicon substrate 100. The spacers may be made of metal pads or silicon. The spacers 122 provide mechanical support and precise vertical height control for the flipped light source 120. The light source 120 can be, but is not limited to, a vertical cavity surface-emitting laser (VCSEL), a surface-emitting light emitting diode (LED), an edge-emitting distributed feedback (DFB) laser, or an edge-emitting Fabry-Perot (FP) laser. The working wavelength of the light source 120 can be, but is not limited to, 633 nm, 850 nm, 980 nm, 1064 nm, 1310 nm, 1490 nm, 1550 nm. The height of the spacers 122 is adjusted such that the highest feature on the surface of the aperture 121 of the light source chip 120 does not touch the surface of the silicon substrate 100 and the contact pads of the light source chip 120 can be securely contacted with the pre-fabricated contact metal pads on the surface of the silicon substrate 100 to provide electrical connection. The height of the spacers typically is, but is not limited to, between 1 μm to 20 μm.

Figure 2A:
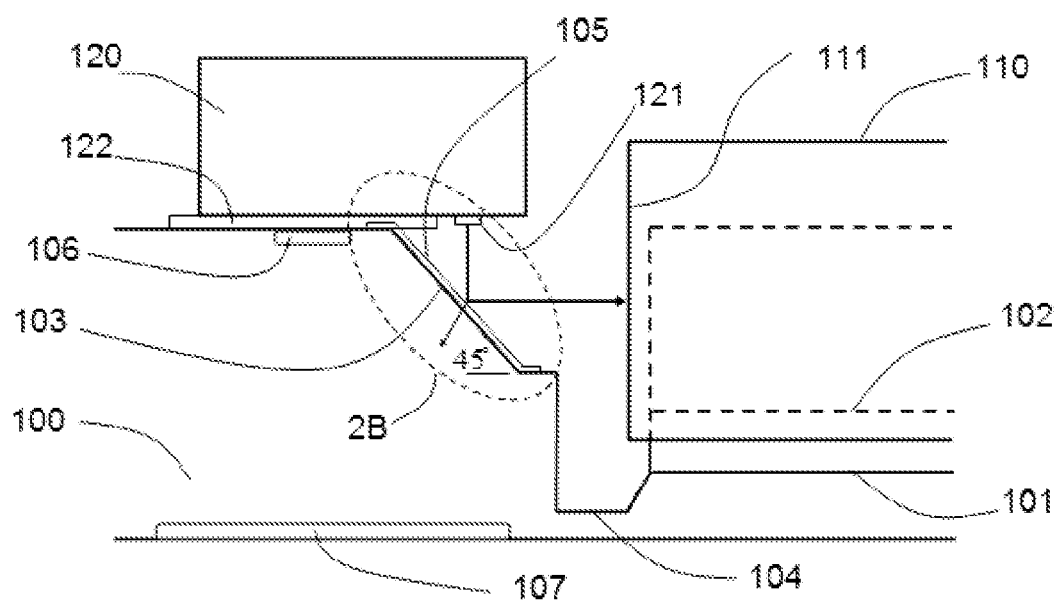
FIG. 2A is a cross section view of the optical transmitter of FIG. 1A taken in a vertical plane passing through the line labeled 2A.

FIG. 2A is a cross sectional view of the optical transmitter of FIG. 1A taken in a vertical plane passing through the line labeled 2A. The desired vertical depth of the mirror is determined by the optical design such that the light spot on the reflecting surface 103 formed by the emitted light from the light source 120 is smaller than the physical dimension of the mirror 103. The vertical depth of the mirror is typically, but is not limited to, between 10 μm to 150 μm. The light emitted from the light source aperture 121 is reflected by the mirror surface 103 and horizontally incident into the input end 111 of a horizontally placed optical fiber 110. The fiber 110 is placed such that the input end 111 is as close as possible to the mirror surface 103. The horizontal distance from the fiber end 111 to the center of the 45° mirror 103 is typically, but is not limited to, between 20 μm to 100 μm. In most cases, closer distance is desirable to achieve smaller coupling loss.

The optical transmitter includes an integrated photodetector for optical power monitoring. The photodetector includes a partial light transmission surface 105, a top contact area 106 formed near the top surface of the silicon substrate 100 by ion-implantation or diffusion ($p^+$ or $n^+$ doping), a bottom contact area 107 formed near the bottom surface of the silicon substrate 100 by ion-implantation or diffusion ($n^+$ or $p^+$ doping), and portions of the optically absorbing substrate 100 which forms a $p^+$-i-$n^+$, $p^+$-p-$p^+$, or $p^+$-n-$p^+$ junction photodiode structure with the contact areas 106 and 107. FIGS. 2B-1, 2B-2 and 2B-3 illustrate enlarged detailed diagrams of three variations of the integrated photodetector of the optical transmitter, i.e. the portion labeled "2B" in FIG. 2A. In the first variation shown in FIG. 2B-1, a thin-film layer 105 (e.g. an anti-reflection coating) which partially transmits light into the absorbing substrate 100 is disposed on the surface of the 45° mirror 103. The transmitted light is absorbed by the substrate 100 and converted to electron-hole pairs. These electrons and holes reach the contact areas 106 and 107 through two processes: drift due to the applied electrical field (when the junction is reverse-biased) and diffusion. These photo induced carriers are eventually collected by the electrodes connected to the contact areas 106 and 107 and form photo-generated electric current. In the second variation shown in FIG. 2B-2, the 45° mirror 103 surface is partially covered with a thin-layer of total-reflection material 105. The light incident on the total-reflection material 105 is totally reflected to the optical fiber 110. A fraction of light power emitted from the aperture 121 of a light source is incident on the mirror surface 103 which is not covered by the total-reflection material 105 and is transmitted through the mirror surface 103 into the substrate 100 and converted into photocurrent. In a third variation shown in FIG. 2B-3, the mirror surface 103 is firstly etched to form a step 108, and the remaining portion of the 45° mirror 103 surface is covered by the total-reflection material 105. The light incident on the step 108 (which has no reflecting material 105) is transmitted into the substrate 100 and converted into photocurrent while the rest of the light is reflected by the total-reflection material 105 to the optical fiber 110. The thin-layer partial or total reflection material 105 can be, but is not limited to, $SiO_2$, $Si_3N_4$, aluminum, gold, or multilayer thin film materials. In any of the above described variations, the percentage of light penetrating into and being absorbed by the substrate 100 is typically 1% to 50%, but in principle can be any percentage.

Figure 3A:
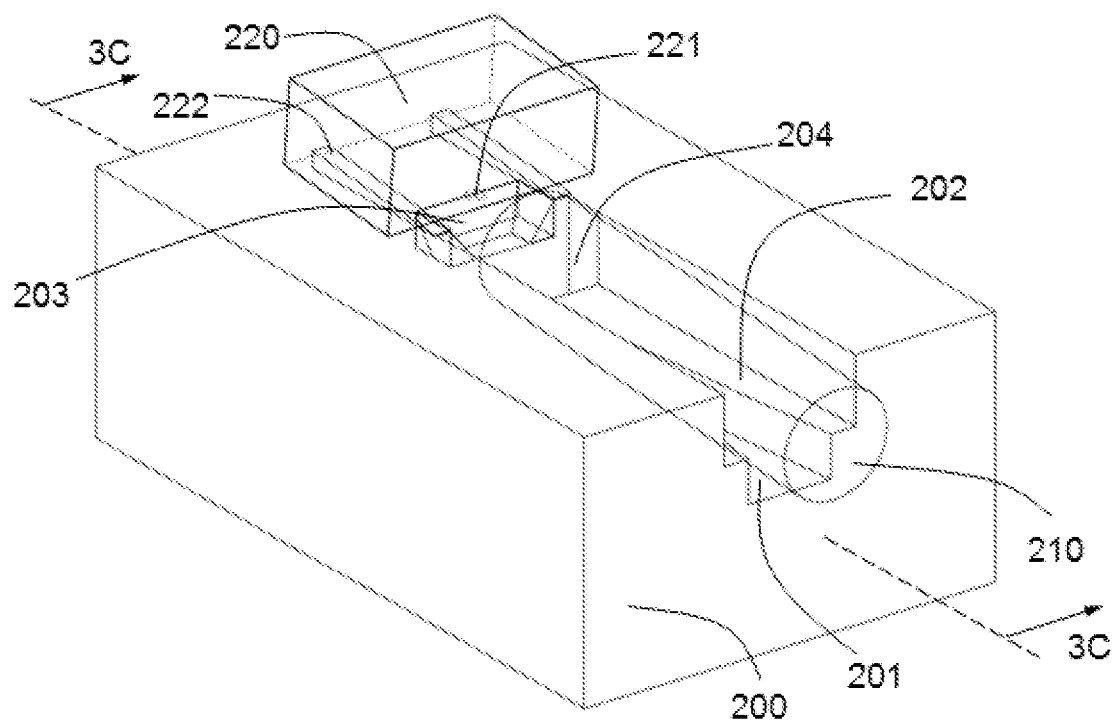
FIG. 3A is a perspective schematic diagram illustrating an optical transmitter according to another embodiment of the present invention. The transmitter includes a 54.7° mirror, a tapered double U-groove structure, a plurality of angled spacer structures, and a flip-chip bonded optical source and an optical fiber self-aligned inside the tapered U-grooves.
Figure 3B:
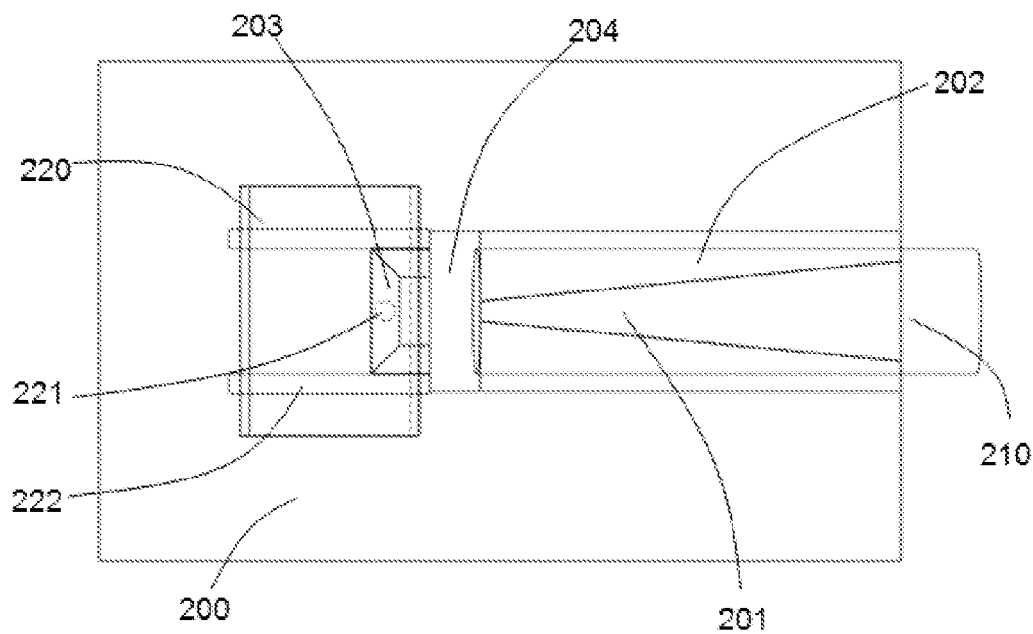
FIG. 3B is a top view of the optical transmitter shown in FIG. 3A.
Figure 3C:
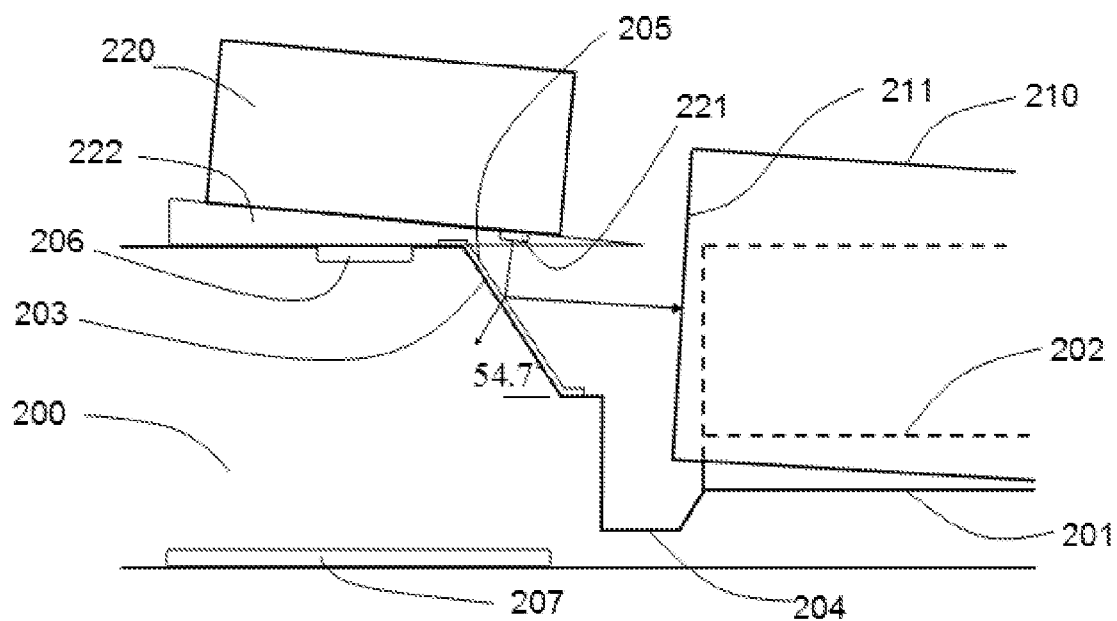
FIG. 3C is a cross section view of the optical transmitter of FIG. 3A taken in a vertical plane passing through the line labeled 3C.
Figure 3D:
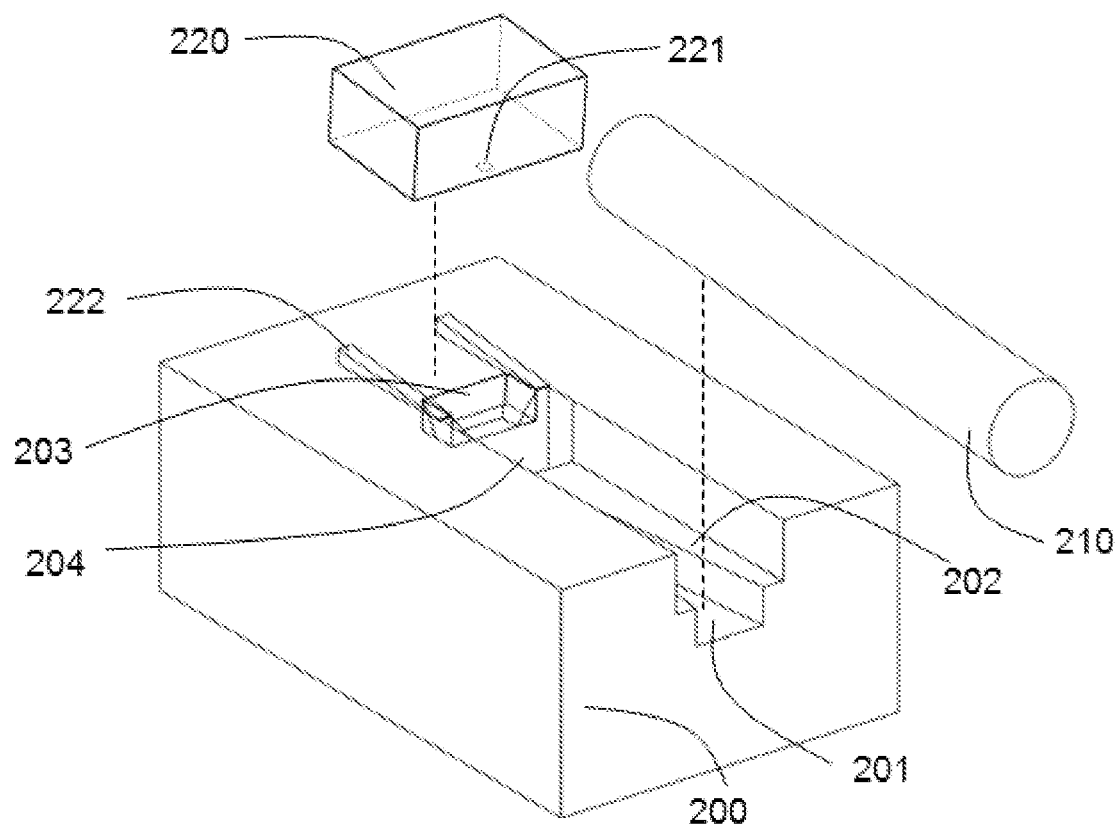
FIG. 3D is an exploded view of the optical transmitter of FIG. 3A.

Another embodiment of the present invention is described with reference to FIGS. 3A-3D. FIG. 3A is a perspective schematic diagram illustrating an optical transmitter according to this embodiment. FIG. 3D is an exploded view of the optical transmitter of FIG. 3A. FIG. 3B is the top view of the optical transmitter. FIG. 3C is a cross section view of the optical transmitter of FIG. 3A taken in a vertical plane passing through the line labeled 3C. The transmitter includes a 54.7° mirror (reflecting surface) 203 formed on a silicon substrate 200. The mirror 203 is formed by wet-etching the silicon substrate 200 from the crystalline plane <100> (top surface) towards the crystalline plane <111>. More specifically, the mirror 203 is formed by etching a V-shaped pit with four 54.7° tilted side walls using wet etching chemicals. The front 54.7° wall 203 is used as the reflecting surface. The vertical depth of the mirror is determined by the optical design such that the light spot on the reflection surface 203 formed by the emitted light from the light source 220 is smaller than the dimension of the mirror 203. During the processing, a lithography overlap between the V-shaped pit and U-shaped grooves is necessary to ensure the process tolerance. The overlapped region eventually forms a deep trench 204 in front of the fiber end 211. The vertical depth of the mirror is typically, but is not limited to, between 10 μm to 150 μm.

Because the 54.7° angle (with respect to the horizontal plane) of the mirror 203 is deviated from the standard 45° angle as in the embodiment of FIG. 1A, the reflected light from the mirror surface 203 deviates by an angle of 19.4° from the horizontal plane if the incident light from the light source 220 is vertical. To compensate for this angle deviation, a lensed fiber or an angled fiber can be used to minimize the coupling loss caused by the tilted incident light. However, such methods increase the complexity and/or cost of the packaging process. In preferred embodiments, either the light source chip 220 or the fiber 210 or both may be tilted such that the light reflected by the mirror 203 enters the fiber at a zero degree angle.

To tilt the light source chip 220, a plurality of spacers 222 may be fabricated as a wedge structure such that the light source chip 220 is placed on the tilted top surface of the wedge shaped spacers. In one implementation (not shown in the drawings), the shape of the spacers 222 is such that the incident light emitted from the aperture 221 of the light source 220 is in the vertical plane passing through the longitudinal direction of the double trench and has a pre-set 9.7° incident angle deviation from the vertical direction. As a result, the light reflected from the 54.7° mirror surface 203 has a zero degree deviation from horizontal plane and can be coupled directly into the horizontally placed optical fiber 210 without additional loss.

To tilt the fiber 210, a tapered double U-groove structure shown as in FIG. 3A may be used. The lower U-groove trench 201 is fabricated such that it has a gradually enlarged opening width as it extends away from the mirror 203. In other words, the two top edges of the lower trench are non-parallel to each other. When the optical fiber 210 is placed on the non-parallel edges of the lower U-groove trench 201, the fiber sinks vertically into the lower U-groove due to the gradually widened opening and tilts downwards as it extends away from the mirror 203 along the elongated rectangular trench structure. The maximum possible sinking depth in the vertically direction is half of the diameter of the optical fiber 210. In the cases when a higher tilted angle is required, multiple tapered U-groove trench structure can be fabricated.

FIGS. 3A-3D illustrate an embodiment in which both wedge shaped spacers and a tapered double U-groove structure are used in combination to accomplish the result that the light reflected by the 54.7° mirror 203 enters the end 211 of the fiber 210 at a zero degree angle.

Figures 1, 2B:
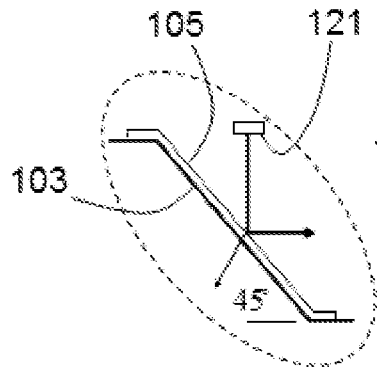
FIGS. 2B-1, 2B-2 and 2B-3 illustrate enlarged detailed diagrams of the three variations of the integrated photodetector of an optical transmitter shown in FIG. 2A.
Figures 2, 2B:
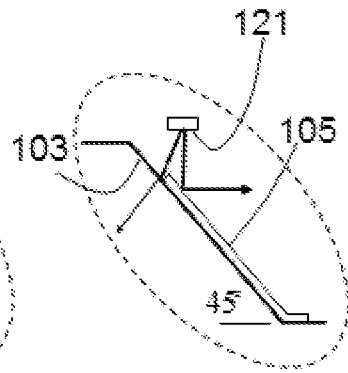
Figures 2, 2B, 3:
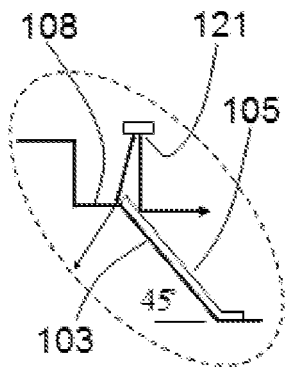

An integrated photodetector can be formed using similar structures as shown in FIGS. 2A to 2B-3, including a partial reflecting surface 205 and contact areas 206 and 207.

Neither the structures nor the embodiments described in this invention are limited to single channel application although embodiments of single channel optical systems are described. The invention also includes structures and methods of coupling a light source array to a multi-mode fiber ribbon using multiple identical structures described above.

While only optical transmitters are described in detail above, the structures and methods described can be easy applied to optical receivers with little modification. To form an optical receiver, the light source 120/220 is replaced with a photodetector with a receiving aperture located above the mirror 103/203. The photodetector is preferably a surface normal photodetector. The mirror 103/203 reflects light from the optical fiber 110/210 to the photodetector. A photodetector formed by the body of the silicon substrate and the contact areas 106, 107 is not needed for the optical receiver.

It will be apparent to those skilled in the art that various modification and variations can be made in the optical system and related fabrication methods of the present invention without departing from the spirit or scope of the invention. Thus, it is intended that the present invention cover modifications and variations that come within the scope of the appended claims and their equivalents.

What is claimed is:

1. An optical system comprising:
   a silicon substrate in a <100> crystal orientation, having a horizontal first surface formed by a <100> crystalline plane;
   a reflecting surface formed by a <110> or <111> crystalline plane of the silicon substrate near the first surface, and
   a double trench structure formed in the silicon substrate for receiving an end portion of an optical fiber, including a first trench located below the first surface of the silicon substrate and a second trench located below a bottom surface of the first trench, the double trench structure extending horizontally along a longitudinal line with a first end located near the reflecting surface, a vertical plane passing through the longitudinal line being perpendicular to the reflecting surface.

2. The optical system of claim 1, wherein the reflecting surface forms a 45° or 54.7° angle with the first surface of the silicon substrate.

3. The optical system of claim 1, wherein the reflecting surface is coated with an anti-reflection coating which partially reflects a light incident upon it and partially transmits the light into the silicon substrate.

4. The optical system of claim 3, wherein the silicon substrate further includes:
   a second surface substantially parallel to the first surface;
   a first doped area formed in the first surface of the silicon substrate; and
   a second doped area formed in the second surface of the silicon substrate,
   wherein the first doped area, an undoped portion of the silicon substrate, and the second doped area form a vertical $p^+$-i-$n^+$, $p^+$-p-$p^+$, or $p^+$-n-$p^+$ junction.

5. The optical system of claim 1, wherein each of the first and second trenches has a rectangular cross section in a plane perpendicular to the longitudinal line.

6. The optical system of claim 1, wherein two top edges of the lower trench are parallel to each other.

7. The optical system of claim 1, wherein two top edges of the lower trench are non-parallel to each other, and an opening width of the lower trench is smaller at the first end of the double trench structure than at an end located away from the reflecting surface.

8. The optical system of claim 1, further comprising one or more spacers disposed on the first surface of the silicon substrate adjacent the reflecting surface for mounting a light source or a photodetector on the silicon substrate.

9. The optical system of claim 8, wherein the spacers have a wedge shape.

10. The optical system of claim 8, further comprising a surface emitting light source mounted on the silicon substrate via the spacers in a flip-chip arrangement, the light source having an emitting aperture located above the reflecting surface.

11. The optical system of claim 10, further comprising an optical fiber disposed in the double trench structure and resting on two top edges of the lower trench, wherein the reflecting surface reflects an incident light from the light source into an end of the optical fiber.

12. The optical system of claim 8, further comprising a surface normal photodetector mounted on the silicon substrate via the spacers in a flip-chip arrangement, the photodetector having a receiving aperture located above the reflecting surface.

13. The optical system of claim 12, further comprising an optical fiber disposed in the double trench structure and resting on two top edges of the lower trench, wherein the reflecting surface reflects an incident light from the optical fiber into the photodetector.

14. A method of coupling a light source to an optical fiber, comprising:
   (a) providing a silicon substrate in a <100> crystal orientation having a horizontal first surface formed by a <100> crystalline plane;

(b) forming a reflecting surface by a <110> or <111> crystalline plane of the silicon substrate near the first surface of the silicon substrate; and (c) forming a double trench structure in the silicon substrate for receiving an end portion of the optical fiber, including a first trench located below the first surface of the silicon substrate and a second trench located below a bottom surface of the first trench, the double trench structure extending horizontally along a longitudinal line with a first end located near the reflecting surface, a vertical plane passing through the longitudinal line being perpendicular to the reflecting surface.

15. The method of claim 14, wherein step (b) comprises etching a V-shaped pit with four tilted side walls into the first surface of the silicon substrate.

16. The method of claim 14, further comprising coating the reflecting surface with an anti-reflection coating which partially reflects a light incident upon it and partially transmits the light into the silicon substrate.

17. The method of claim 14, further comprising:
forming a first doped area in the first surface of the silicon substrate; and
forming a second doped area in a second surface of the silicon substrate which is substantially parallel to the first surface,
wherein the first doped area, an undoped portion of the silicon substrate, and the second doped area form a vertical $p^+$-i-$n^+$, $p^+$-p-$p^+$, or $p^+$-n-$p^+$ junction.

18. The method of claim 14, wherein step (c) comprises:
etching the first trench into the first side of the silicon substrate; and
subsequently etching the second trench into the bottom surface of the first trench,
wherein each of the first and second trenches has a rectangular cross section in a plane perpendicular to the longitudinal line.

19. The method of claim 14, wherein two top edges of the lower trench are parallel to each other.

20. The method of claim 14, wherein two top edges of the lower trench are non-parallel to each other, and an opening width of the lower trench is smaller at the first end of the double trench structure than at an end located away from the reflecting surface.

21. The method of claim 14, further comprising forming one or more spacers on the first surface of the silicon substrate adjacent the reflecting surface.

22. The method of claim 21, wherein the spacers have a wedge shape.

23. The method of claim 21, further comprising flip-chip mounting a surface emitting light source on the silicon substrate via the spacers, the light source having an emitting aperture located above the reflecting surface.

24. The method of claim 23, further comprising placing an optical fiber in the double trench structure and resting it on two top edges of the lower trench.

25. The method of claim 21, further comprising flip-chip mounting a surface normal photodetector on the silicon substrate via the spacers.

26. The method of claim 25, further comprising placing an optical fiber in the double trench structure and resting on two top edges of the lower trench.

* * * * *